United States Patent [19]

Osakabe et al.

[11] 3,956,709

[45] May 11, 1976

[54] BALANCE CONTROL SYSTEM FOR MULTICHANNEL AUDIO APPARATUS

[75] Inventors: Yoshio Osakabe, Yokohama; Koichi Ishizaka, Tokyo; Sumio Satoh, Yokohama, all of Japan

[73] Assignee: Sony Corporation, Tokyo, Japan

[22] Filed: Dec. 19, 1974

[21] Appl. No.: 534,302

[30] Foreign Application Priority Data

Dec. 27, 1973 Japan ............................... 49-14437

[52] U.S. Cl. ............................ 330/124 R; 179/1 G; 330/30 R

[51] Int. Cl.² ........................................... H03F 3/68

[58] Field of Search ...................... 330/30 R, 124 R; 179/1 G, 1 GQ, 100.1 TD, 100.4 ST; 84/1.25

[56] References Cited

UNITED STATES PATENTS 3,835,237 9/1974 Adachi ............................ 84/1.25 X

*Primary Examiner*—James B. Mullins

*Attorney, Agent, or Firm*—Lewis H. Eslinger; Alvin Sinderbrand

[57] ABSTRACT

A balance control system for multichannel audio apparatus wherein stereophonic signals are transmitted through plural audio channels of the audio apparatus. The balance control system includes a balance control network connected to the audio channels for selectively adjusting the relative amplitudes of the respective stereophonic signals transmitted therethrough with respect to each other. The balance control system further includes at least one signal delay circuit included in at least one of the audio channels for establishing relative delays among the transmitted stereophonic signals. The delay circuit is controlled simultaneously with the control of the balance control network.

13 Claims, 3 Drawing Figures

BALANCE CONTROL SYSTEM FOR MULTICHANNEL AUDIO APPARATUS

BACKGROUND OF THE INVENTION

This invention relates to a balance control system for multichannel audio apparatus and, in particular, to an improved balance control system wherein both amplitudes and times of arrival at a given point stereophonic reproduced sterophonic sounds are balanced.

In stereophonic sound reproducing apparatus, particularly of the type designated for entertainment purposes, desirable sound characteristics will be sensed by a listener who is positioned at a generally central location with respect to the sound transducers. For example, if the stereophonic sounds are reproduced by two conventional loudspeaker systems, the listener generally will be located at a point which is substantially equidistant from both loudspeaker systems. At that point, optimum sound sensation is perceived if the sounds produced by the left and right loudspeaker systems, for example, are of equal amplitude. Since the listener is equidistant from each loudspeaker system, the propagation time required for the respective reproduced sounds to reach the listener's location is equal and the arriving sound waves will admit of the proper relative phase. Now, if the listener changes his position with respect to the loudspeaker systems, the relative sound characteristics transmitted to his new location should be adjusted with respect to each other to compensate for the change in position. This adjustment is performed by a balance control circuit which usually is provided in the stereophonic signal reproducing apparatus in an attempt to restore to the listener the same sound sensations that had previously been sensed, notwithstanding his change in location. For example, if the listener is now located closer to the left loudspeader system than to the right loudspeaker system, the magnitude of the sound propagated from the left loudspeaker system should be reduced, while the magnitude of the sound propagated from the right loudspeaker system should be increased. The conventional balance control circuit attains this balance in the propagated sounds by reducing the audio signal transmitted over the left signal channel while increasing the audio signal transmitted over the right signal channel. It is expected that, since the left channel sound signals are reduced with respect to the right channel sound signals, but the listener is closer to the left loudspeaker system, then the greater propagation attenuation of the right channel sound signals will result in the arrival at the listener's location of sounds admitting of the same relative magnitude as when the listener had previously been located at the equidistant position.

Unfortunately, it has been found that, since the listener is now located closer to one loudspeaker system than to the other, the propagation times required for the respective sounds to arrive at the listener's position are no longer equal. That is, consistent with the foregoing example, the sound wave emitted from the left loudspeaker system arrives at the listener's location in advance of the sound wave emitted from the right loudspeaker system. Therefore, although the sound volume is in balance, the impinging sound waves are out of phase with respect to each other, thereby having a deleterious effect upon the received acoustic image.

OBJECTS OF THE INVENTION

Therefore, it is an object of the present invention to provide an improved balance control system for multichannel audio apparatus which overcomes the aforenoted defects of prior art balance systems.

It is another object of this invention to provide an improved balance control system for multichannel audio apparatus wherein the propagated sound signals arrive at the listener's location in phase with respect to each other.

Yet another object of the invention is to provide an improved balance control system for multichannel audio apparatus wherein an adjustable relative delay is imparted to the stereophonic signals transmitted through the audio channels. A further object of this invention is to provide a balance control system wherein both the relative amplitudes and the relative phases of reproduced stereophonic sounds are adjustable.

An additional object of this invention is to provide a balance control system for multichannel audio apparatus wherein the reproduced stereophonic sounds are delayed with respect to each other to compensate for the relative position of a listener with respect to the stereophonic sound transducers.

Various other objects and advantages of the present invention wil become apparent from the forthcoming detailed description and the novel features will be particularly pointed out in the appended claims.

SUMMARY OF THE INVENTION

In accordance with the present invention, a balance control system for multichannel audio apparatus is provided including a balance control circuit connected to the audio channels for selectively controlling the relative amplitudes of respective stereophonic signals transmitted therethrough with respect to each other; and a signal delay network is provided to selectively delay the transmitted stereophonic signals with respect to each other, the signal delay network being controllable simultaneously with the balance control circuit.

BRIEF DESCRIPTION OF THE DRAWINGS

The following detailed description will best be understood in conjunction with the accompanying drawings wherein.

DETAILED DESCRIPTION OF CERTAIN ONES OF THE PREFERRED EMBODIMENTS

Figure 1:
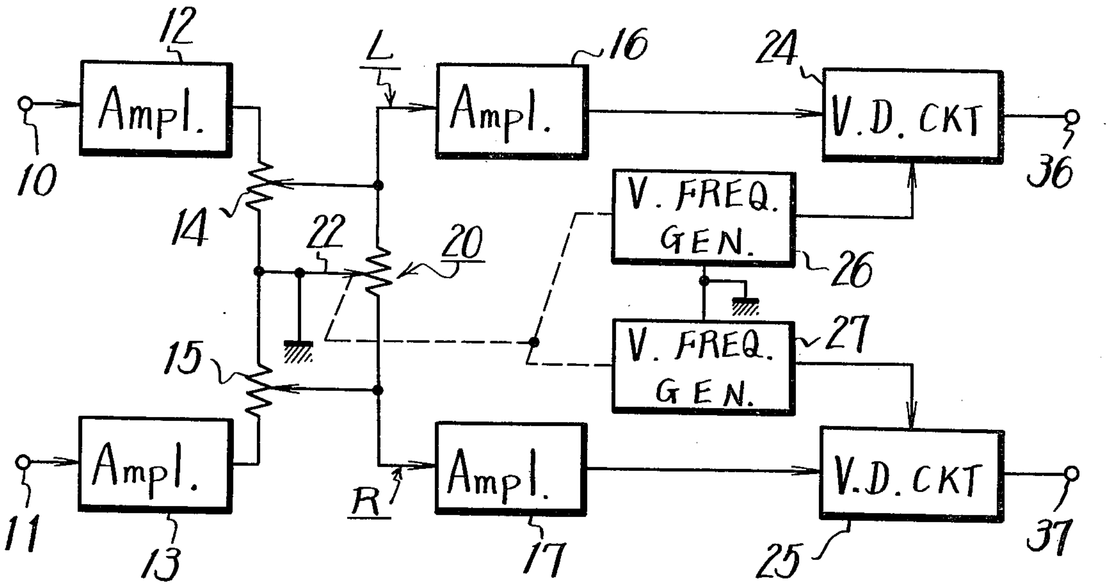
FIG. 1 is a block diagram of one embodiment of this invention.

Referring now to the drawings and, in particular, to FIG. 1, a portion of stereophonic signal reproducing apparatus including left and right audio channels is illustrated. The illustrated apparatus is adapted to receive the respective left and right audio signals and to transmit these signals over the respective left and right audio channels to sound transducers, not shown. The left channel L includes an input terminal 10, a preamplifer 12, a volume adjusting circuit 14, a power amplifier 16 and an output terminal 36. The right channel R is similar to the aforedescribed left channel and includes an input terminal 11, a preamplifier 13, a volume adjusting circuit 15, a power amplifier 17 and an output terminal 37. The left channel input terminal 10 is adapted to receive a processed left channel audio signal and is connected to the preamplifier 12. As is recognized, the preamplifer is conventional and is adapted to provide amplification to the received left channel audio signal. The output of the preamplifier 12 is connected through the volume adjusting circuit 14 to the power amplifier 16. The volume adjusting circuit 14 is illustrated as a variable resistance element adapted to provide selective attenuation to the amplified audio signal, as desired. Accordingly, the variable resistance element may comprise a potentiometer connected between the output of the preamplifier 12 and a reference potential, such as ground. As is conventional, the potentiometer 14 includes a movable contact, the selective positioning thereof being determinative of the degree of attenuation of the left channel audio signal.

The output of the potentiometer is coupled to the power amplifer 16 to provide further amplification of the left channel audio signal compatible with the requirements of the loudspeaker system (not shown) which may be coupled to the output terminal 36. The output of the power amplifier 16 is coupled to the output terminal 36 by a variable delay circuit 24. As will soon be described, this variable delay circuit is adapted to impart a selective time delay to the left channel audio signal transmitted therethrough.

The right channel R, being substantially similar to the just-described left channel L, need not be described in detail. Suffice it to say that the right channel input terminal 11 is adapted to receive a right channel audio signal and to supply this signal to the preamplifier 13 whereat a suitable amplification of such supplied signal is attained. The volume adjusting circuit 15 connected to the output of the preamplifier 13 may comprise a potentiometer which is similar to the aforedescribed potentiometer 14. The output of the potentiometer is seen to be coupled to the power amplifier 17, and the output of the power amplifier is, in turn, connected to the output terminal 37 through a variable delay circuit 25. The purpose of the variable delay circuit 25 is similar to that of the variable delay circuit 24 and, as will be shown, these variable delay circuits are controlled in an inverse manner with respect to each other.

As further shown in FIG. 1, a balance control circuit 20 is connected to the left and right audio channels and is adapted to selectively control the relative amplitudes of the respective audio signals transmitted through these channels. In one embodiment of a balance control circuit, a variable resistance element is connected across the left and right channels and is adapted to vary the relative impedence thereacross. In particular, the variable resistance element is illustrated as comprising a potentiometer connected across the respective outputs of the volume adjusting circuits 14 and 15, the potentiometer having a movable contact 22 which is supplied with a reference potential, such as ground. It is appreciated that the output impedence of the volume adjusting circuit 14 and the output impedence of the volume adjusting circuit 15 is a function of the selected positioning of the movable contact 22. That is, if the movable contact 22 is relatively closer to the top portion of the illustrated potentiometer 20, the impedence across the output of the volume adjusting circuit 14 is less than the impedence across the output of the volume adjusting circuit 15, thereby decreasing the amplitude of the left channel audio signal with respect to the right channel audio signal. Conversely, if the movable contact 22 is relatively closer to the lower portion of the potentiometer 20, the amplitude of the right channel audio signal is decreased with respect to the amplitude of the left channel audio signal.

Turning now to the variable delay circuits 24 and 25, these circuits are substantially identical and each is responsive to a control signal applied thereto for establishing a signal delay in accordance with the characteristics of the applied signal. Although various embodiments of variable delay circuits exhibiting this function can be envisaged, the circuits 24 and 25 each are preferably a charge transfer device (CTD) or, alternatively, a digital delay line. Those of ordinary skill in the art will recognize that such variable delay circuits have a time delay which is determinative by the frequency of a clock pulse control signal applied thereto. That is, a higher clock pulse frequency causes a lower time delay to be established and, conversely, a lower clock pulse frequency establishes a higher time delay. A typical delay circuit comprises a shift register, such as an analog signal shift register, including a plurality of stages and wherein an input signal is successively shifted to sequential stages in accordance with a clock pulse applied thereto. The time required for the input signal to be propagated to a predetermined stage is seen to be a function of the clock pulse frequency. Of course, the variable delay circuits may comprise any other conventional frequency controllable delay circuit, as desired.

The respective control signals applied to the variable delay circuits 24 and 25 are produced by the control signal generating circuits 26 and 27, respectively. Such control signal generating circuits are, of course, compatible with the variable delay circuit and, for the embodiment under consideration, each control signal generating circuit comprises a variable frequency pulse generator. As will soon be described in greater detail, the frequencies of the respective pulse signals produced by the pulse signal generators 26 and 27 are adjustable in accordance with an inverse relationship with respect to each other. That is, if the frequency of the pulses generated by the pulse generator 26 increases, the frequency of the pulses generated by the pulse generator 27 decreases. The converse relationship also obtains.

The respective frequencies of the pulse signals generated by the pulse generators are manually adjustable and, as represented by the broken lines of FIG. 1, the pulse generators 26 and 27 are mechanically coupled to the potentiometer 20 so as to be adjustable simultaneously therewith. That is, as the potentiometer is adjusted to balance the relative amplitudes of the left and right channel audio signals, the pulse generators are concurrently adjusted to vary the respective frequencies of the pulse signals generated thereby, resulting in a corresponding change in the delays established by the variable delay circuits 24 and 25. The mechanical coupling between the potentiometer 20 and the pulse generators 26 and 27 is such that when the amplitude of the left channel audio signal is reduced with respect to the amplitude of the right channel audio signal, the frequency of the pulse signals generated by the pulse generator 26 is relatively decreased and the frequency of the pulse signals generated by the pulse generator 27 is relatively increased. Accordingly, the delay imparted to the left channel audio signal by the variable delay circuit 24 is greater than the delay imparted to the right channel audio signal by the variable delay circuit 25.

Figure 2:
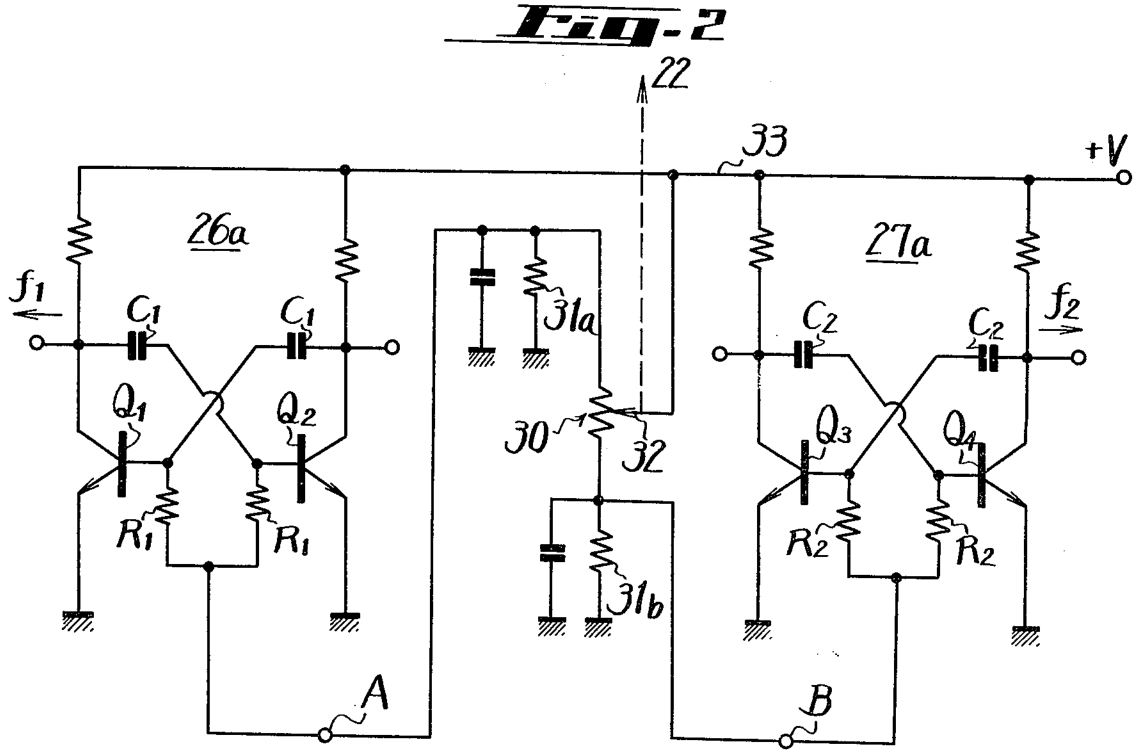
FIG. 2 is a schematic diagram of one component included in an embodiment of the present invention.

One embodiment of the variable frequency pulse generating circuits 26 and 27 will now be described with reference to the schematic diagram illustrated in FIG. 2. As shown, each of the variable frequency pulse generators is comprised of a free-running oscillating circuit, such as astable multivibrators 26*a* and 27*a*, respectively. The astable multivibrator 26*a* is of conventional construction and is adapted to generate output pulses having a variable frequency $f_1$ to be supplied to the variable delay circuit 24. The astable multivibrator is formed of a pair of transistors $Q_1$ and $Q_2$ having cross-coupled collector and base electrodes interconnected via the coupling capacitors $C_1$. In addition, base biasing resistors $R_1$ are connected between the respective base electrodes of the transistors and a common point A. The astable multivibrator 27*a* is adapted to generate pulses of a variable frequency $f_2$ to be supplied to the variable delay circuit 25. Accordingly, this astable multivibrator is substantially similar to the afore-described astable multivibrator 26*a* and includes a pair of transistors $Q_3$ and $Q_4$ having their collector and base electrodes connected in cross-coupled fashion by the coupling capacitors $C_2$. The base bias resistors $R_2$ connected to the respective base electrodes of the transistors $Q_3$ and $Q_4$ are further connected in common to the point B. The reference points A and B of the respective astable multivibrator circuits are coupled to ground by respective bias circuits formed of resistors 31*a* and 31*b*, respectively, together with parallel-connected capacitors, as shown. Moreover, the reference points A and B are interconnected by the variable resistance element 30. The variable resistance element may comprise a potentiometer having a movable contact 32 which is electrically connected to a source of energizing potential +V via an energizing conductor 33. It should be apparent that the movable contact 32 of the potentiometer 30 is mechanically coupled to the movable contact 22 of the potentiometer 20 so as to be ganged for simultaneous adjustment therewith.

By reason of the potentiometer 30 which interconnects the astable multivibrators 26*a* and 27*a*, it is clear that, as the position of the movable contact 32 is varied, the bias potentials supplied to the reference points A and B are similarly varied. For example, if the movable contact 32 is moved in a downward direction so that a greater portion of the resistance of the potentiometer 30 is connected to the point A than to the point B, then the reference point A is provided with a bias potential that is less than the bias potential supplied to the reference point B. The smaller bias potential at the reference point A causes the astable multivibrator 26*a* to generate output pulses having a frequency $f_1$ which is less than the pulse frequency $f_2$ generated by the astable multivibrator 27*a*. Hence, an adjustment to the potentiometer 30 results in a corresponding change in the frequencies of the pulses generated by the variable frequency pulse generators 36 and 37, this change in pulse frequencies having an inverse relationship with respect to each other. It is recalled that, as the frequency of the pulses applied to the variable delay circuit 24 decreases, the time delay added thereby to the left channel is increased. Conversely, as the frequency of the pulses applied to the variable delay circuit 25 by the variable frequency pulse generator 27 increases, the time delay added to the right channel decreases. The mathematical relationship between the time delay T exhibited by each of the variable delay circuits and the pulse frequency $f$ of the pulse signals applied thereto can be expressed as $T=m/f$, where $m$ represents the bit number of the variable delay circuit (i.e., the bit number of the CTD), which also represents the number of the output stage of the digital delay line. Since the bit number $m$ is a constant, it is seen that the time delay T added to the respective audio channels is inversely proportional to the pulse frequency $f$.

A typical signal balancing operation will now be described. Let it initially be assumed that the amplitude balancing potentiometer 20 and the delay balancing potentiometer 30 have been set such that a listener located equidistant from the left and right loudspeaker systems perceives desirable sound characteristics. Now, if this listener changes position so as to now be located relatively closer to the left loudspeaker system, it is appreciated that the sounds reproduced by the left loudspeaker system will be of greater perceived volume than the sounds reproduced by the right loudspeaker system. It is expected that such listener will restore the relative balance to the sound volume by appropriately adjusting the movable contact 22 of the potentiometer 20 so that the amplitude of the left channel audio signal is reduced with respect to the amplitude of the right channel audio signal. As the potentiometer 20 is so adjusted, the potentiometer 30 will be simultaneously adjusted. In particular, in this example wherein the level of the left channel signal is reduced with respect to the level of the right channel signal the movable contact 32 of the potentiometer 30 will be adjusted such that the bias potential applied to the reference point A will be reduced with respect to the bias potential applied to the reference point B. Consequently, the pulse frequency $f_1$ of the pulse signals generated by the astable multivibrator 26*a* will be less than the pulse frequency $f_2$ of the pulse signals generated by the astable multivibrator 27*a*. Hence, the delay added to the left channel by the variable delay circuit 24 is greater than the delay added to the right channel by the variable delay circuit 25. Therefore, the left channel audio signal is delayed with respect to the right channel audio signal. Since the listener has been assumed to be positioned at a location that is relatively closer to the left loudspeaker system than to the right loudspeaker system, it is seen that the greater delay added to the left channel taken in conjunction with the smaller propagation time required for the left channel audio signal to reach the listener will result in the left and right channel audio signals being received by the listener at substantially the same time and thus in the proper phase with respect to each other. That is, the greater delay provided by the variable delay circuit 24 summed with the smaller propagation time of the left channel audio signal will be substantially equal to the smaller delay established by the variable delay circuit 25 summed with the greater propagation time of the right channel audio signal. Therefore, both the relative amplitude and the relative phase of the respective stereophonic signals will be balanced in accordance with the simultaneous adjustment to the potentiometers 20 and 30.

Figure 3:
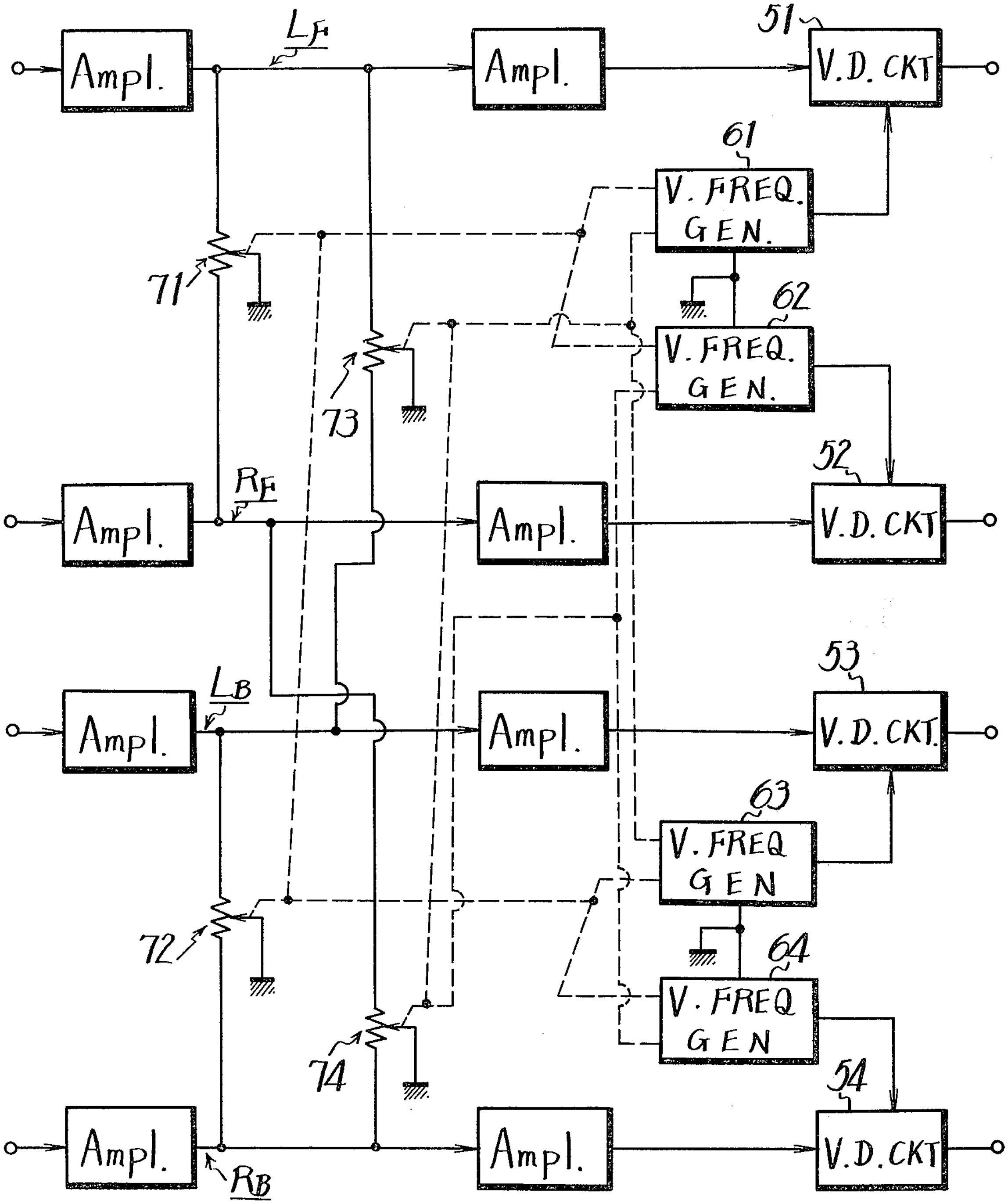
FIG. 3 is a block diagram of an alternative embodiment of the present invention.

Although FIG. 1 illustrates one embodiment of the present invention in the environment of a two-channel stereophonic signal reproducing system, it is appreciated that the principles set forth hereinabove are equally applicable to a four-channel stereophonic signal reproducing system. The application of the present invention to such a four-channel stereophonic signal reproducing system is illustrated in FIG. 3. In a conventional four-channel audio system, the respective channels usually are designated the left-front channel, the right-front channel, the left-back channel and the right-back channel. Consistent with this convention, the illustrated channels of the four-channel system are designated $L_F$, $R_F$, $L_B$ and $R_B$, respectively. Each of these channels is provided with a preamplifier and a power amplifier, similar to the corresponding elements described with respect to FIG. 1, and in addition, a variable delay circuit 51, 52, 53 and 54 is provided in each of the channels $L_F$, $R_F$, $L_B$ and $R_B$, respectively. Each of these variable delay circuits is substantially similar to the aforedescribed variable delay circuits of FIG. 1 and, therefore, in the interest of brevity, further description thereof need not be provided.

The respective time delays established by these variable delay circuits is an inverse function of the pulse frequency of control pulse signals applied thereto, as is appreciated. Accordingly, variable frequency pulse generators 61, 62, 63 and 64 are coupled to the variable delay circuits 51, 52, 53 and 54, respectively, to supply the variable frequency control pulses to these variable delay circuits in the manner previously described with respect to FIG. 1. The pulse generators 61 and 62 form a first pair of pulse generating circuits such that the frequencies of the pulse signals generated thereby are inversely related to each other, as was described with respect to the frequencies $f_1$ and $f_2$. Similarly, the pulse generators 63 and 64 form a second pair of pulse generating circuits adapted to generate pulse signals having inversely related frequencies. It is therefore appreciated that a potentiometer, similar to potentiometer 30, can be connected between the pulse generators 61 and 62, and a further potentiometer can be connected between the pulse generators 63 and 64. These respective potentiometers are adjustable simultaneously with the adjustment to the amplitude balance control circuits, to be described.

Pulse generator 61, which is the $L_F$ pulse generator, and the pulse generator 63, which is the $L_B$ channel pulse generator, form another pair of variable frequency pulse generators adapted to generate pulse signals having inversely related frequencies. Accordingly, although not shown, a potentiometer similar to the potentiometer 30 can be connected between the respective pulse generators. Further, the pulse generator 62, which is the $R_F$ channel pulse generator, and the pulse generator 64, which is the $R_B$ channel pulse generator, form a further pair of variable frequency pulse generating circuits adapted to generate pulses having inversely related frequencies. Hence, although not shown, a potentiometer such as the potentiometer 30 can be connected between the pulse generators 62 and 64.

It is recognized that, in a four-channel stereophonic signal reproducing system, when the respective stereophonic signals are to be balanced to compensate for a change in the relative location of the listener, the $L_F$ channel and the $R_F$ channel signals should be balanced with respect to each other, as should the $L_B$ channel and the $R_B$ channel signals. Also, the $L_F$ channel and the $L_B$ channel signals might have to be balanced with respect to each other. Finally, the $R_F$ and the $R_B$ channel signals might also require balancing. Therefore, to achieve such amplitude balancing, the potentiometers 71, 72, 73 and 74 are provided between the $L_F$ and $R_F$ channels, the $L_B$ and $R_B$ channels, the $L_F$ and $L_B$ channels and the $R_F$ and $R_B$ channels, respectively. As the potentiometer 71 is adjusted to balance the $L_F$ and $R_F$ channels, the respective delays added to these channels by the variable delay circuits 51 and 52 should likewise be balanced. Accordingly, as is depicted by the broken line, the variable frequency pulse generators 61 and 62 are mechanically coupled to the potentiometer 71 so as to be adjustable simultaneously therewith. Similarly, the variable frequency pulse generators 63 and 64 are mechanically coupled to the potentiometer 72 for simultaneous adjustment so that, as the amplitude levels of the $L_B$ and $R_B$ channels are balanced, the relative delays added to these channels are likewise adjusted. Also, since the $L_F$ and $L_B$ channels are adapted to be balanced by the potentiometer 73, it is seen that the variable frequency pulse generators 61 and 63 are mechanically coupled to that potentiometer so as to be simultaneously adjustable therewith. Hence, an adjustment to the relative levels of the $L_F$ and $L_B$ channels is simultaneously accompanied by an adjustment in the relative delays added to these channels. For a similar purpose, the potentiometer 74 is mechanically coupled to the variable frequency pulse generators 62 and 64.

In the event that left and right channel balance adjustment should be achieved by a single manual operation and the front and back channel adjustments should also be achieved by a single manual operation, the potentiometers 71 and 72 can be ganged for simultaneous operation and the potentiometers 73 and 74 can also be ganged. In that embodiment, a single adjustment will result in the balancing of the $L_F$ channel and the $R_F$ channel signal levels, together with the appropriate delays imparted thereto, and a balancing of the $L_B$ and $R_B$ channel signal levels, together with the appropriate delays imparted to these respective signals. Similarly, a single manual adjustment to the front and back balancing circuit will result in the balancing of the $L_F$ and $L_B$ channel signal levels, together with the appropriate delays imparted to these respective signals, and a balancing of the $R_F$ and $R_B$ channel signal levels, together with the appropriate delays imparted to these respective signals.

While the present invention has been particularly shown and described with reference to certain preferred embodiments thereof, it will be readily apparent that various changes and modifications in form and details can be made without departing from the spirit and scope of the invention. For example, although potentiometers have been described to effect a signal level balance, it is appreciated that variable amlifiers can be provided in the respective audio signal channels having inversely adjustable amplification factors. It is therefore intended that the appended claims be interpreted as including the foregoing as well as other such changes and modifications.

What is claimed is:

1. A balance control system for multichannel audio apparatus wherein stereophonic signals are transmitted through at least two audio channels of said audio apparatus, comprising:

adjustable balance control means connected to said audio channels for selectively controlling the relative amplitudes of the respective stereophonic signals transmitted therethrough with respect to each other; and adjustable signal delay means included in at least one of said audio channels, said signal delay means being adjustable simultaneously with said balance control means for selectively delaying the stereophonic signal transmitted through said one audio channel with respect to the remaining stereophonic signals.

2. The balance control system of claim 1 wherein said multichannel audio apparatus includes two audio channels and wherein said signal delay means comprises a signal delay circuit in each of said audio channels.

3. The balance control system of claim 2 wherein each of said signal delay circuits comprises a variable delay circuit connected in series with one of said audio channels and responsive to a control signal applied thereto for establishing a corresponding delay; and control signal generating means adjustable simultaneously with said balance control means and connected to said variable delay circuit for generating a control signal determinative of said delay.

4. The balance control system of claim 3 wherein each of said variable delay circuits comprises a frequency dependent delay circuit for establishing said delay in accordance with the frequency of said control signal applied thereto; and said control signal generating means comprises variable frequency signal generating means.

5. The balance control system of claim 4 wherein each of said frequency dependent delay circuits comprises charge transfer means.

6. The balance control system of claim 2 wherein said signal delay circuits comprise variable delay circuits for establishing respective delays in accordance with respective control signals applied thereto; and control signal generating circuits coupled to said respective variable delay circuits and adjustable simultaneously with said balance control means for generating respective control signals having an inverse relationship to each other such that the delay established by the variable delay circuit in one of said two audio channels is decreased when the delay established by the variable delay circuit in the other of said two audio channels is increased.

7. The balance control system of claim 6 wherein said variable delay circuits are frequency dependent delay circuits; and wherein said control signal generating circuits comprise first and second variable oscillators coupled to respective ones of said frequency dependent delay circuits, said variable oscillators being coupled to adjustable biasing means for supplying first and second bias potentials thereto to determine the oscillating frequencies of said first and second variable oscillators, respectively, said adjustable biasing means being adjusted simultaneously with said balance control means, whereby said first and second bias potentials are inversely adjustable with respect to each other.

8. The balance control system of claim 7 wherein said balance control means comprises a balancing potentiometer coupled between said audio channels; and said adjustable biasing means comprises a further potentiometer coupled between said variable oscillators; said balancing potentiometer and said variable potentiometer being ganged for simultaneous adjustment.

9. The balance control system of claim 6 wherein said multichannel audio apparatus includes two additional audio channels, each including variable delay circuits for establishing respective delays in accordance with respective control signals applied thereto.

10. The balance control system of claim 9 further including additional control signal generating circuits adjustable simultaneously with said balance control means and coupled to the respective additional variable delay circuits for generating said respective control signals.

11. The balance control system of claim 10 wherein said balance control means comprises a plurality of balancing potentiometers coupled between respective ones of said audio channels and wherein pairs of said balancing potentiometers are ganged for simultaneous adjustment and pairs of said control signal generating means are adjustable simultaneously with associated pairs of said balancing potentiometers.

12. A balance control system for multichannel audio apparatus wherein stereophonic signals are transmitted through four audio channels of said audio apparatus, comprising:

balance control means connected to said audio channels including a first balance control circuit coupled to first and second audio channels for selectively adjusting the relative amplitudes of first and second stereophonic signals with respect to each other; a second balance control circuit coupled to third and fourth audio channels for selectively adjusting the relative amplitudes of third and fourth stereophonic signals with respect to each other; a third balance control circuit coupled to said first and third audio channels for selectively adjusting the relative amplitudes of said first and third stereophonic signals with respect to each other; and a fourth balance control circuit coupled to said second and fourth audio channels for selectively adjusting the relative amplitudes of said second and fourth stereophonic signals with respect to each other;

a variable delay circuit included in each of said audio channels and responsive to a control signal applied thereto for imparting a corresponding delay to the stereophonic signal transmitted through said audio channel; and control signal generating circuits coupled to respective ones of said variable delay circuits and operable in respective pairs simultaneously with at least one of said balance control circuits for generating control signals determinative of said corresponding delays.

13. The balance control system of claim 12 wherein each of said balance control circuits comprises a balancing potentiometer connected across associated audio channels; and wherein first and second ones of said control signal generating circuits are adjustable simultaneously with said first balancing potentiometer for adjusting the control signals generated thereby in an inverse relationship with respect to each other, third and fourth ones of said control signal generating circuits are adjustable simultaneously with said second balancing potentiometer for adjusting the control signals generated thereby in an inverse relationship with respect to each other, said first and third control signal generating circuits are adjustable simultaneously with said third balancing potentiometer for adjusting the control signals generated thereby in an inverse relationship with respect to each other, and said second and fourth control signal generating circuits are adjustable simultaneously with said fourth balancing potentiometer for adjusting the control signals generated thereby in an inverse relationship with respect to each other.

* * * * *

UNITED STATES PATENT OFFICE
CERTIFICATE OF CORRECTION

Patent No. 3,956,709 Dated May 11, 1976

Inventor(s) Yoshio Osakabe, Koichi Ishizaka and Sumio Satoh

It is certified that error appears in the above-identified patent and that said Letters Patent are hereby corrected as shown below:

In the heading

[30] change "49-14437" to --49-144378--,

Column 1, line 9, delete "stereophonic",

Column 1, line 10, change "sterophonic" to --stereophonic--,

Column 2, line 12, change "the" to --this--,

Column 2, line 28, change "wil" to --will--,

Column 6, line 29, after "signal" insert --,--,

Column 7, line 37, change "adjustment" to --adjustments--,

Column 8, line 24, change "justment" to --justments--,

Column 8, line 49, change "amlifiers" to --amplifiers--,

Signed and Sealed this

First Day of February 1977

[SEAL]

*Attest:*

RUTH C. MASON
*Attesting Officer*

C. MARSHALL DANN
*Commissioner of Patents and Trademarks*